(12) United States Patent
Oh

(10) Patent No.: US 7,777,853 B2
(45) Date of Patent: Aug. 17, 2010

(54) METHOD FOR FORMING PAD ELECTRODE, METHOD FOR MANUFACTURING LIQUID CRYSTAL DISPLAY DEVICE USING THE SAME, AND LIQUID CRYSTAL DISPLAY DEVICE MANUFACTURED BY THE METHOD

(75) Inventor: Jae Young Oh, Uiwang-shi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/585,083

(22) Filed: Sep. 2, 2009

(65) Prior Publication Data

US 2010/0007840 A1    Jan. 14, 2010

Related U.S. Application Data

(62) Division of application No. 11/304,792, filed on Dec. 16, 2005, now Pat. No. 7,692,751.

(30) Foreign Application Priority Data

Apr. 11, 2005  (KR) .................. 10-2005-0029937

(51) Int. Cl.
G02F 1/1343    (2006.01)
G02F 1/1345    (2006.01)

(52) U.S. Cl. ........................ 349/141; 349/149

(58) Field of Classification Search ............ 349/141, 349/149

See application file for complete search history.

(56) References Cited

U.S. PATENT DOCUMENTS

| | | | |
|---|---|---|---|
| 6,022,753 A * | 2/2000 | Park et al. ............ 438/30 |
| 6,319,643 B1 * | 11/2001 | Singh et al. ............ 430/30 |
| 6,867,081 B2 | 3/2005 | Weng et al. | |
| 6,980,268 B2 | 12/2005 | You | |
| 2003/0086046 A1 * | 5/2003 | You ................... 349/149 |

FOREIGN PATENT DOCUMENTS

| | | |
|---|---|---|
| DE | 10355666 A1 | 7/2004 |
| DE | 10361006 A1 | 8/2004 |
| JP | 07-263700 | 10/1995 |
| JP | 10-090719 | 4/1998 |
| JP | 11-163364 | 6/1999 |
| JP | 11-295747 | 10/1999 |
| JP | 2001-005038 | 1/2001 |
| JP | 2003-131008 | 5/2003 |
| JP | 2003-258256 | 9/2003 |
| JP | 2004-349640 | 12/2004 |

* cited by examiner

Primary Examiner—Mike Qi
(74) Attorney, Agent, or Firm—McKenna Long & Aldridge LLP

(57) ABSTRACT

A simplified method for forming a pad electrode without using an additional light-irradiation device is disclosed. The method includes forming a gate pad on a substrate, forming a gate insulating layer on a substrate surface, forming a data pad on the gate insulating layer, forming a passivation layer on the substrate surface, forming a first contact hole in the gate insulating layer and the passivation layer, forming a second contact hole in the passivation layer, coating a conductive photoresist on the substrate surface, and forming a gate pad electrode in the first contact hole and a data pad electrode in the second contact hole by ashing the conductive photoresist. The pad electrode is formed in a simple method of ashing the conductive photoresist, thereby decreasing costs.

13 Claims, 14 Drawing Sheets

METHOD FOR FORMING PAD ELECTRODE, METHOD FOR MANUFACTURING LIQUID CRYSTAL DISPLAY DEVICE USING THE SAME, AND LIQUID CRYSTAL DISPLAY DEVICE MANUFACTURED BY THE METHOD

This application is a divisional application of application Ser. No. 11/304,792, filed Dec. 16, 2005, now U.S. Pat. No. 7,692,751 which claims the benefit of Korean Patent Application No. 10-2005-0029937, filed on Apr. 11, 2005, both of which are hereby incorporated by reference for all purposes as if fully set forth herein.

BACKGROUND OF THE INVENTION

1. Field of the Invention

The present invention relates to a liquid crystal display (LCD) device, and more particularly, to a method for forming a pad electrode of an LCD device.

2. Discussion of the Related Art

Ultra-thin flat type display devices include display screens having a thickness of several centimeters. Liquid crystal display (LCD) devices are ultra-thin flat type display devices that attract attention because they can be widely used for notebook computers, monitors, spacecraft, aircraft, etc.

The LCD device includes a thin film transistor array substrate, a color filter array substrate, and a liquid crystal layer. The thin film transistor array substrate includes a thin film transistor and a pixel electrode. The color filter array substrate includes a color filter layer and a common electrode. The thin film transistor array substrate is provided at a predetermined interval from the color filter array substrate. The liquid crystal layer is formed between the thin film transistor array substrate and color filter array substrates. If a voltage is applied to the pixel electrode of the thin film transistor array substrate and the common electrode of the color filter array substrate, an arrangement of liquid crystal molecules of the liquid crystal layer is changed. Thus, it is possible to control the light transmittance, thereby displaying images.

Hereinafter, a thin film transistor array substrate of an LCD device according to the related art will be described with reference to the accompanying drawings.

FIG. 1A is a plan view illustrating a unit pixel region of a thin film transistor array substrate in an LCD device according to the related art. FIG. 1B is a cross sectional view taken along line I-I' of FIG. 1A.

As shown in FIG. 1A, a plurality of gate lines 10 are formed in a first direction on a substrate 1. Then, a plurality of data lines 20 are formed in a second direction substantially perpendicular to the first direction. That is, a plurality of pixel regions 32 are defined by the plurality of gate and data lines 10 and 20.

A plurality of thin film transistors T are formed at respective crossings of the gate and data lines 10 and 20. Each of the thin film transistors T includes a gate electrode, a semiconductor layer, a source electrode, and a drain electrode.

Then, a transparent pixel electrode 30 is formed in the pixel region, wherein the transparent pixel electrode 30 is electrically connected with the thin film transistor T.

A gate pad 12 is formed at a terminal of the gate line 10. Also, a gate pad electrode 40a is formed on the gate pad 12, for connecting to a driving circuit.

In addition, a data pad 22 is formed at a terminal of the data line 20. Also, a data pad electrode 40b is formed on the data pad 22, for connecting to the driving circuit.

Referring to FIG. 1B, a gate insulating layer 15 and a passivation layer 25 are sequentially deposited on the gate pad 12. Thus, the gate pad 12 is connected with the gate pad electrode 40a by a contact hole.

Also, the passivation layer 25 is formed on the data pad 22. Thus, the data pad 22 is connected with the data pad electrode 40b by a contact hole.

A method for connecting the gate pad electrode 40a with the gate pad 12 and for connecting the data pad electrode 40b with the data pad 22 will be described with reference to FIGS. 2A to 2G.

FIGS. 2A to 2G are cross sectional views taken along line I-I of FIG. 1A, and illustrate a process for respectively connecting the gate pad electrode 40a and the data pad electrode 40b with the gate pad 12 and the data pad 22.

As shown in FIG. 2A, the gate pad 12, the gate insulating layer 15, the data pad 22, and the passivation layer 25 are sequentially formed on the substrate 1. Then, contact holes are formed on the gate pad 12 and the data pad 22.

Referring to FIG. 2B, a material layer for a pad electrode 40 is formed on an entire surface of the substrate 1.

As shown in FIG. 2C, a photoresist layer 50 is formed on the material layer for the pad electrode 40.

Then, as shown in FIG. 2D, after the gate pad 12 and the data pad 22 are covered with a mask 60, the entire surface of the substrate 1 is exposed to light.

Referring to FIG. 2E, the photoresist layer 50 is patterned by development to form photoresist pattern layers 50a and 50b on the gate pad 12 and the data pad 22. Because the portions of the photoresist layer 50 are irradiated by light are removed, the photoresist pattern layers 50a and 50b are formed only on the gate pad 12 and the data pad 22.

Then, as shown in FIG. 2F, the material layer for pad electrode 40 is etched using the photoresist pattern layers 50a and 50b as a mask, to form gate pad electrode 40a and data pad electrode 40b.

Referring to FIG. 2G, as the photoresist pattern layers 50a and 50b are removed, the gate pad electrode 40a is connected with the gate pad 12, and the data pad electrode 40b is connected with the data pad 22.

However, the related art method of forming the pad electrode has the following disadvantages.

To form the gate pad electrode 40a and the data pad electrode 40b, it is necessary to perform photolithography with exposure and development. However, the photolithography requires an additional light-irradiation device for providing light. Thus, process costs increase. In addition, the process is complicated.

SUMMARY OF THE INVENTION

Accordingly, the present invention is directed to a method for forming a pad electrode that substantially obviates one or more problems due to limitations and disadvantages of the related art.

An advantage of the present invention is to provide a simplified method for forming a pad electrode without using an additional light-irradiation device.

Another advantage of the present invention is to provide a method for manufacturing an LCD device, in which a process for forming gate and data pad electrodes is applied to another process for forming other components of the LCD device.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described, a method of forming a pad electrode of an LCD device includes: forming a gate pad on a substrate; forming a gate insulating layer on a surface of the substrate including the gate pad; forming a data pad on the gate insulating layer; forming a passivation layer on the surface of the substrate including the data pad; forming a first contact hole in the gate insulating layer and the passivation layer on the gate pad; forming a second contact hole in the passivation layer on the data pad; coating a conductive photoresist on the surface of the substrate including the first contact hole and the second contact hole; and forming a gate pad electrode in the first contact hole and a data pad electrode in the second contact hole by ashing the conductive photoresist.

The pad electrode may be formed of conductive photoresist, and the pad electrode may be formed in the contact hole with a simple method of ashing the conductive photoresist. Thus, it is possible to decrease cost and realize the simplified process. Also, the ashing process may be performed with oxygen plasma.

Also, the process for forming the pad electrode by ashing the conductive photoresist may be applied to another process for forming other components of the LCD device.

In another aspect of the present invention, a method of manufacturing an LCD device includes: forming a metal line on a substrate; forming an insulating layer on a surface of the substrate including the metal line; forming a hole in the insulating layer on the metal line; coating a conductive photoresist on the surface of the substrate including the hole; and forming a disconnection-prevention line of conductive photoresist in the hole by ashing the conductive photoresist.

In another aspect of the present invention, a method of manufacturing an LCD device includes: forming a gate electrode and a common electrode on a substrate; forming a gate insulating layer on a surface of the substrate; forming a semiconductor layer on a predetermined portion of the gate insulating layer; forming source and drain electrodes on both sides of the semiconductor layer, forming a pixel electrode substantially in parallel with the common electrode; forming a passivation layer on the surface of the substrate; forming a contact hole in the passivation layer between the drain electrode and the pixel electrode; coating a conductive photoresist on the surface of the substrate including the contact hole; and forming a bridge electrode of conductive photoresist in the contact hole by ashing the coated conductive photoresist.

The pixel electrode and the source and drain electrodes may be formed at the same time. Instead, the pixel electrode and the common electrode may be formed at the same time.

In another aspect of the present invention, a method of manufacturing an LCD device includes: forming a gate electrode, a common electrode, and a pixel electrode on a substrate, wherein the common electrode is formed substantially in parallel with the pixel electrode; forming a gate insulating layer on a surface of the substrate; forming a semiconductor layer on a predetermined portion of the gate insulating layer; forming source and drain electrodes on both sides of the semiconductor layer; forming a passivation layer on the surface of the substrate; forming a contact hole in the gate insulating layer and the passivation layer between the drain electrode and the pixel electrode; coating a conductive photoresist on the surface of the substrate including the contact hole; and forming a bridge electrode of conductive photoresist in the contact hole by ashing the coated conductive photoresist.

In another aspect of the present invention, an LCD device includes: a substrate; gate and data pads on the substrate; an insulating layer on a surface of the substrate, wherein the insulating layer has contact holes that correspond to the gate and data pads; and gate and data pad electrodes respectively connected with the gate and data pads through the contact holes, wherein the gate and data pad electrodes are formed of conductive photoresist.

In another aspect of the present invention, an LCD device includes: a substrate; a gate line formed in a first direction on the substrate; a data line formed in a second direction substantially perpendicular to the first direction; an insulating layer on the substrate, wherein the insulating layer has a contact hole that corresponds to at least one of the gate and data lines; and a disconnection-prevention line connected with the at least one of the gate and data lines through the contact hole, wherein the disconnection-prevention line is formed of conductive photoresist.

In another aspect of the present invention, an LCD device includes: a substrate; gate and data lines substantially perpendicular to each other on the substrate, so as to define a unit pixel region; common and pixel electrodes substantially parallel to each other inside the unit pixel region; a thin film transistor at a crossing of the gate and data lines, wherein the thin film transistor includes a gate electrode, a semiconductor layer, a source electrode, and a drain electrode; and a bridge electrode that connects the drain electrode and the pixel electrode, wherein the bridge electrode is formed of conductive photoresist.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or similar parts.

First Embodiment

Figure 1A:
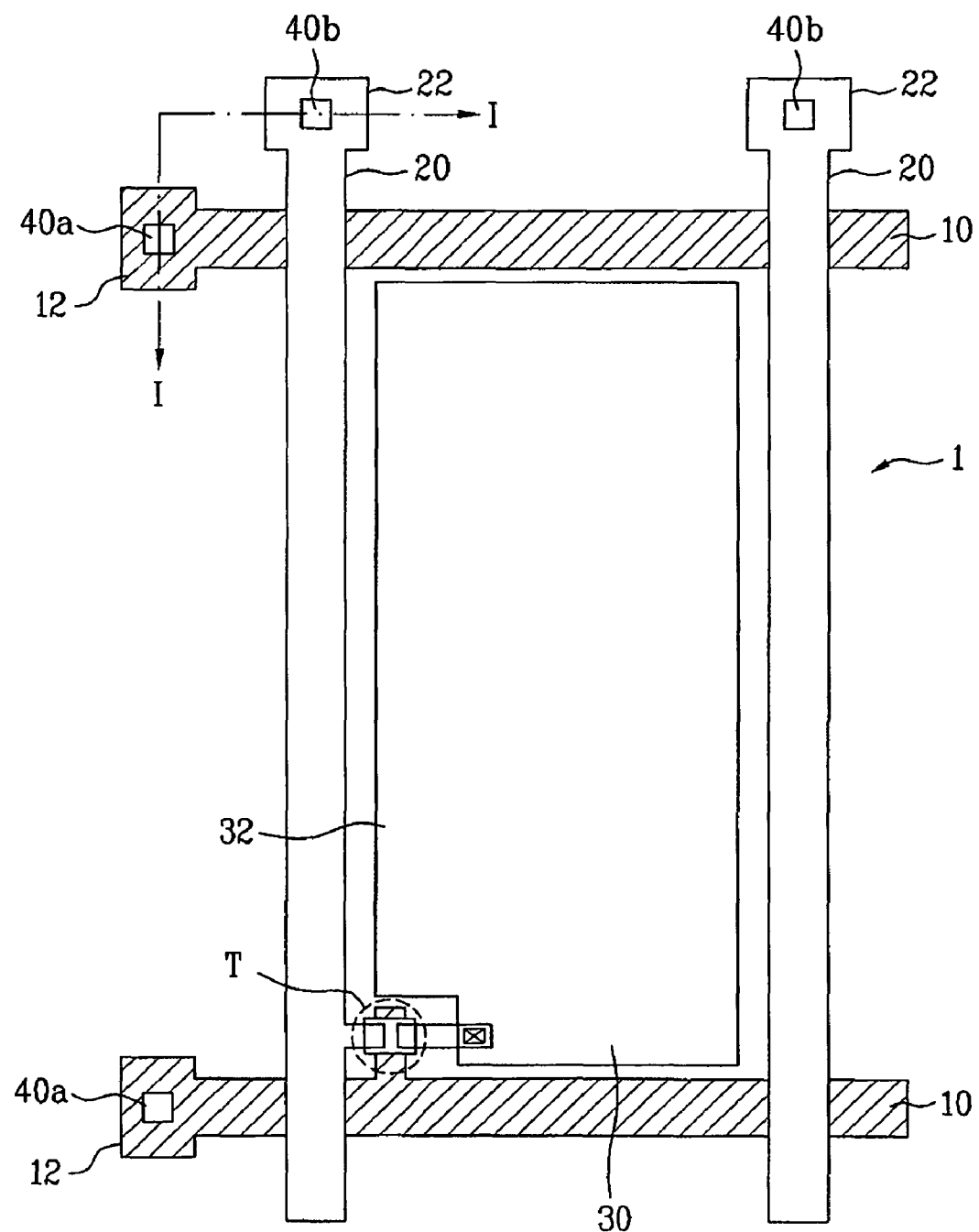
FIG. 1A is a plan view illustrating a unit pixel region of a thin film transistor array substrate of an LCD device according to the related art.
Figure 1B:
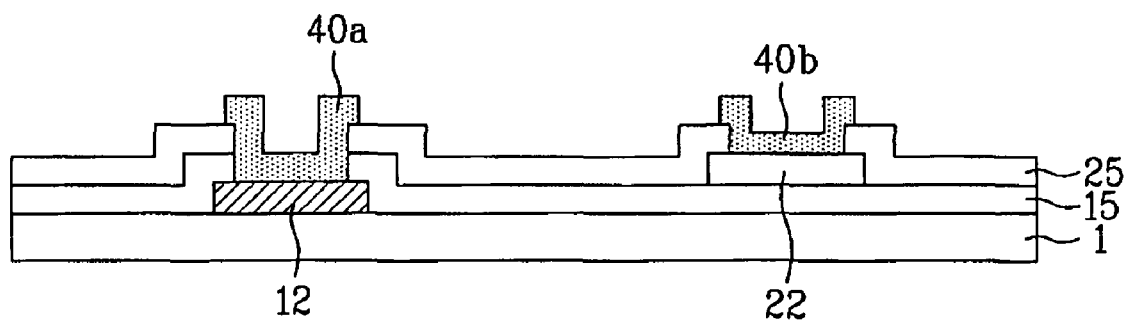
FIG. 1B is a cross sectional view taken along line I-I of FIG. 1A.
Figure 2A:
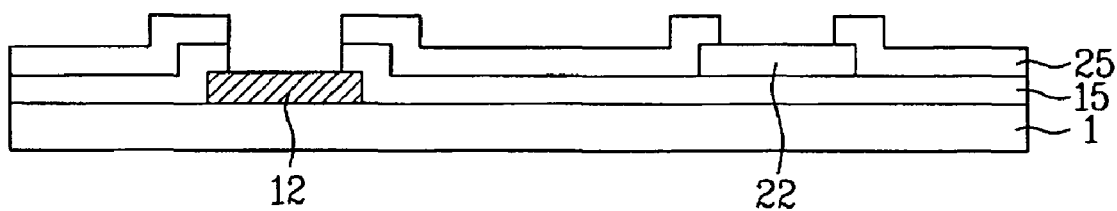
FIGS. 2A to 2G are cross sectional views illustrating a process for respectively connecting gate and data pad electrodes with gate and data pads through contact holes in a thin film transistor array substrate according to the related art.
Figure 2B:
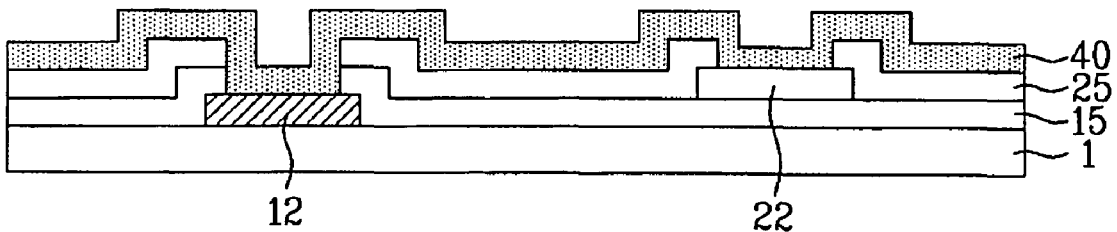
Figure 2C:
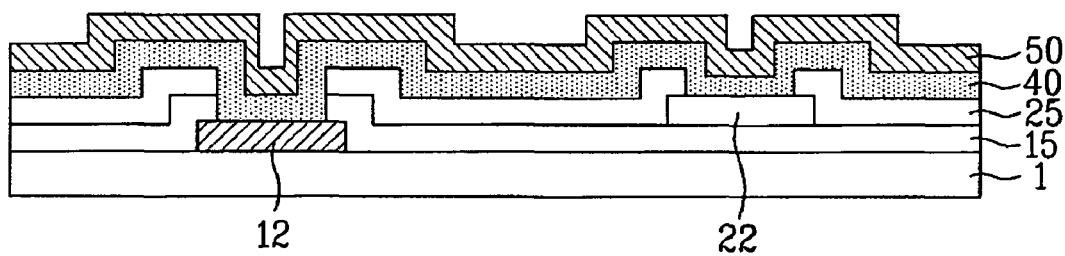
Figure 2D:
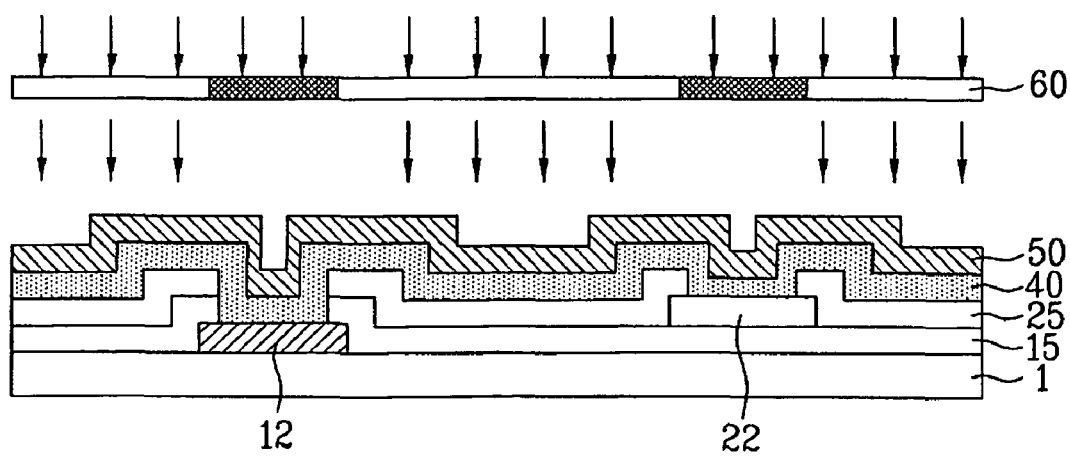
Figure 2E:
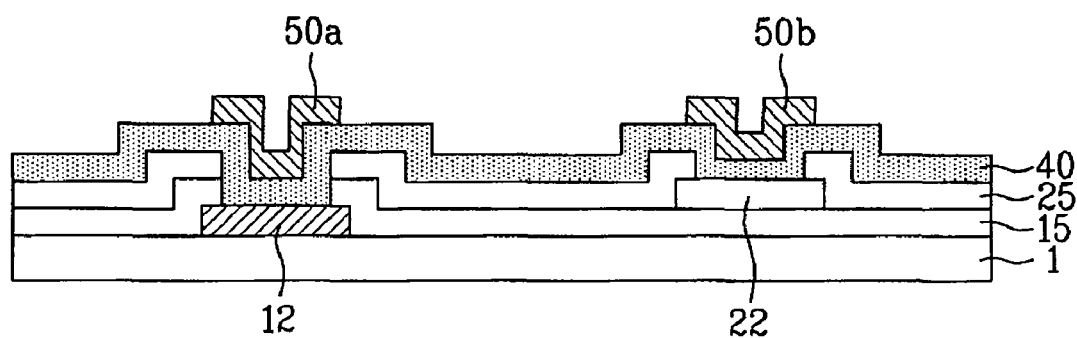
Figure 2F:
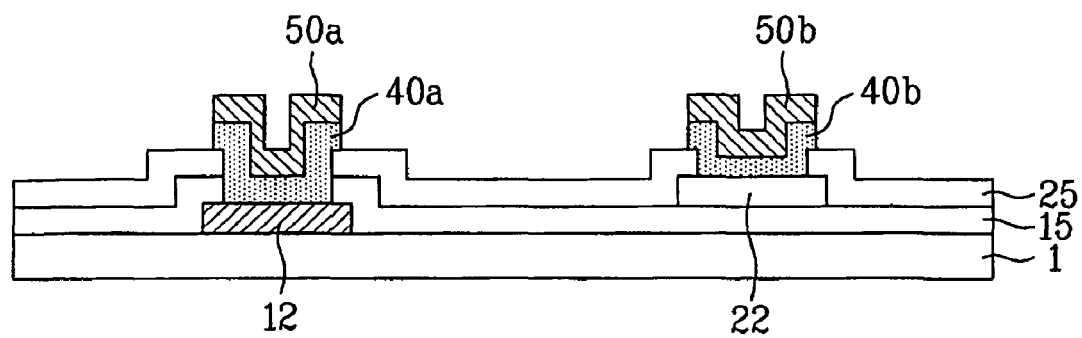
Figure 2G:
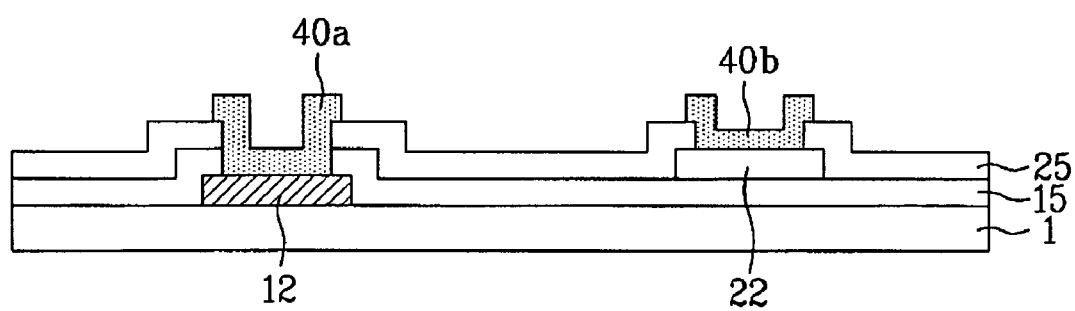

FIGS. 3A to 3D are cross sectional views illustrating a process for forming a pad electrode of an LCD device according to the present invention, taken along line I-I of FIG. 1A. Hereinafter, an explanation will be limited to a pad electrode. Accordingly, other components of the LCD device may be variably formed within the scope known to those skilled in the art.

Figure 3A:
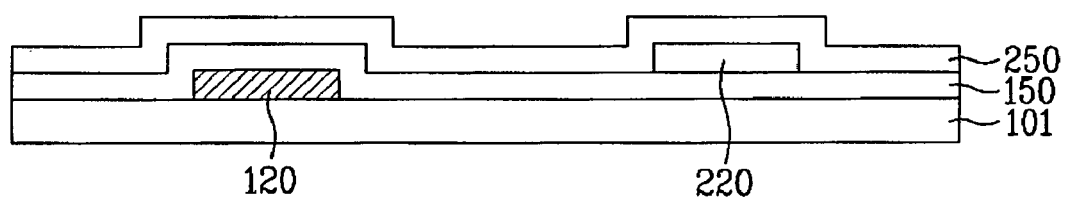
FIGS. 3A to 3D are cross sectional views illustrating a method for forming a pad electrode in an LCD device according to the present invention.

First, as shown in FIG. 3A, a gate pad 120 is formed on a substrate 101, and a gate insulating layer 150 may be formed on an entire surface of the substrate 101 including the gate pad 120. Then, a data pad 220 is formed on the gate insulating layer 150, and a passivation layer 250 may be formed on the entire surface of the substrate 101 including the data pad 220.

The gate insulating layer 150 and the passivation layer 250 may be formed of a same material or different materials.

If the material of the gate insulating layer 150 is different than the material of the passivation layer 250, an undercut etch may be generated when forming a contact hole. In the related art, this causes a pad electrode to possibly be disconnected by the photolithographic processing. However, in the present invention, even if the undercut etch is generated during the process of forming the contact hole, it is possible to prevent the disconnection of the pad electrode. This is explained with reference to FIGS. 4A and 4B.

Figure 3B:
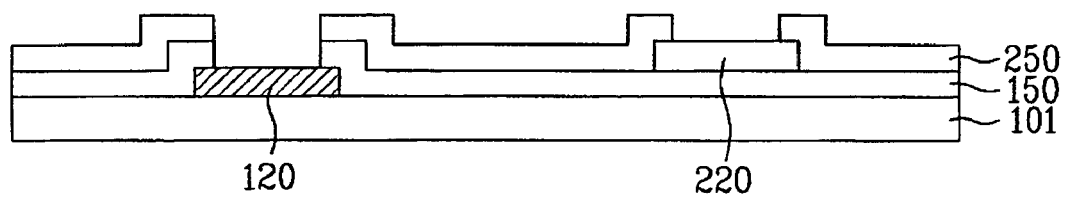

Referring to FIG. 3B, a first contact hole is formed on the gate pad 120 in the gate insulating layer 150 and the passivation layer 250. Also, a second contact hole is formed on the data pad 220 in the passivation layer 250. The first and second contact holes may be formed at the same time.

Figure 3C:
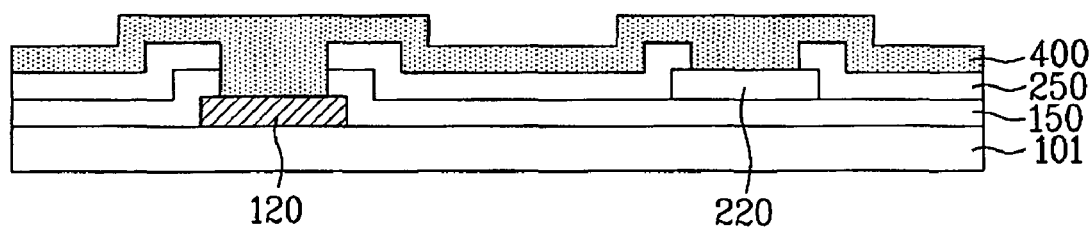

Then, as shown in FIG. 3C, a conductive photoresist 400 may be coated on the entire surface of the substrate 101 including the first and second contact holes. The conductive photoresist 400 is formed of conducting polymer. The conducting polymer has a conductivity based on the delocalization of a conjugated double bond material. The polymer is delocalized by removing electrons or inserting electrons, wherein the conjugated double bond material may have both single bonds and double bonds which are alternately arranged. Electrons may be removed by p-type doping. Electrons may be inserted by n-type doping.

Preferably, the conducting polymer is formed of a material selected from groups of

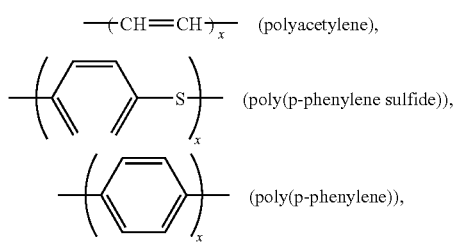

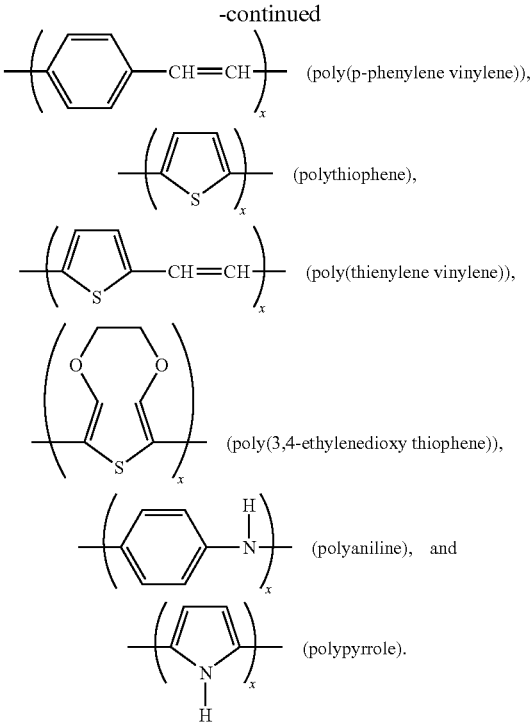

However, any conducting polymer may be applied in the present invention.

Figure 3D:
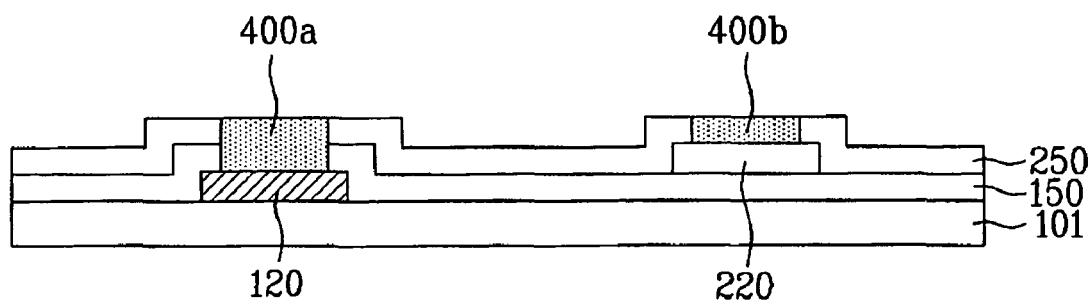

Referring to FIG. 3D, a gate pad electrode 400a is formed in the first contact hole, and a data pad electrode 400b is formed in the second contact hole by ashing the conductive photoresist 400.

In the ashing process, CO and $CO_2$ are removed from the conductive photoresist 400 including the conducting polymer by combustion under predetermined conditions, such as, oxygen plasma.

Accordingly, the gate pad electrode 400a and the data pad electrode 400b are formed in a simplified process by ashing the conductive photoresist 400.

Furthermore, the method for forming the pad electrode according to the present invention prevents the disconnection of pad electrode.

Figure 4A:
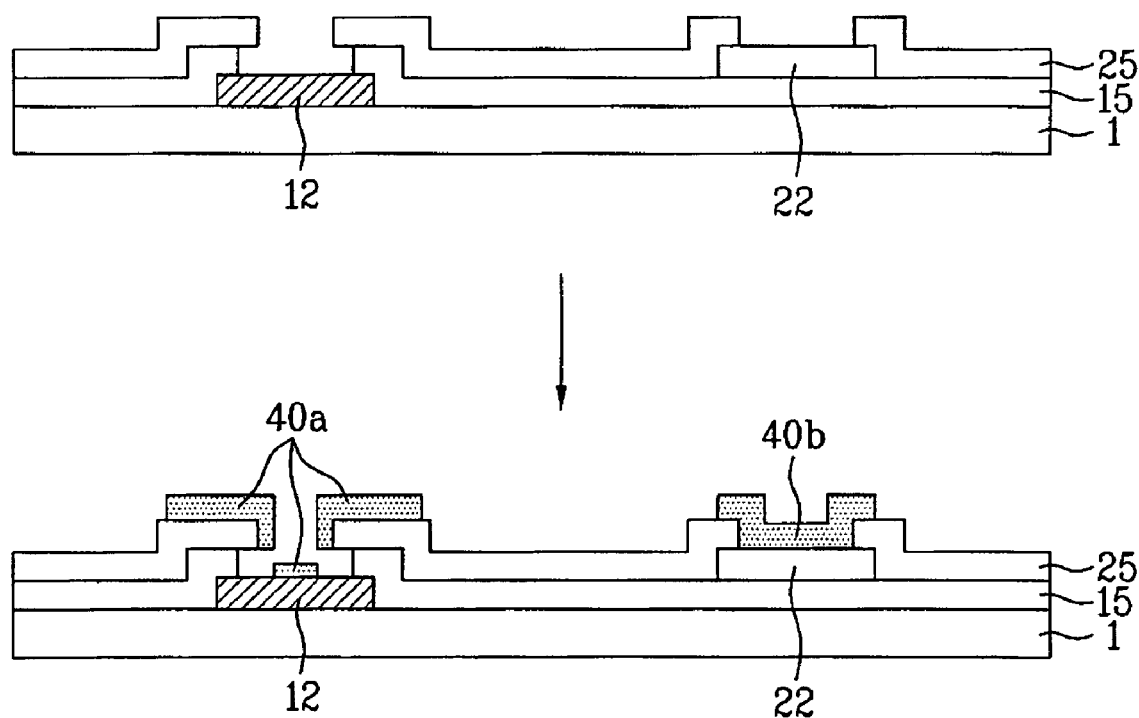
FIG. 4A is a cross sectional view illustrating a problem of the related art, for example, a disconnection of a pad electrode by photolithography.
Figure 4B:
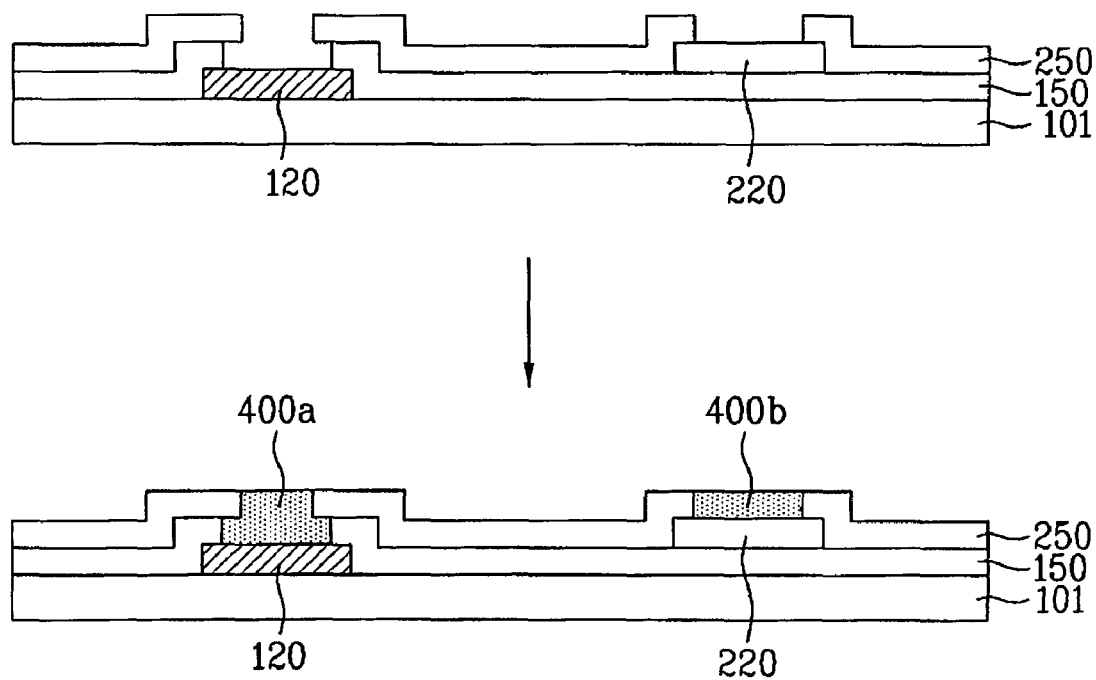
FIG. 4B is a cross sectional view illustrating a structure for preventing a disconnection of a pad electrode in an LCD device according to the present invention.

FIG. 4A is a cross sectional view illustrating a problem of the related art, for example, the disconnection of the pad electrode by photolithography. FIG. 4B is a cross sectional view illustrating a structure for preventing the disconnection of the pad electrode in the LCD device according to the present invention.

In the related art, as shown in FIG. 4A, if contact holes are formed by etching a gate insulating layer 15 and a passivation layer 25 on a gate pad 12 of a substrate 1, an etching undercut is generated because an etching ratio for the gate insulating layer 15 is higher than an etching ratio for the passivation layer 25. That is, the gate insulating layer 15 is etched inwardly more than the passivation layer 25. The etching undercut is generated when the material of the gate insulating layer 15 is different than the material of the passivation layer 25.

If photolithography is then used in the related art as shown in FIGS. 2A to 2G, a gate pad electrode 40a may be cut into three parts, as shown in FIG. 4A.

In case of the present invention, as shown in FIG. 4B, even though the undercut etch is generated, the gate pad electrode 400a is not disconnected since the gate pad electrode 400a is formed by ashing a conductive photoresist.

Accordingly, the method for forming the pad electrode according to the present invention is even more useful when the gate insulating layer 150 is made of a different material than the passivation layer 250.

In addition, an LCD device manufactured by the method of forming the pad electrode according to the present invention will be described as follows.

Referring to FIG. 3D, the LCD device includes the substrate 101, the gate pad 120, the data pad 220, the insulating layers 150 and 250, the gate pad electrode 400a, and the data pad electrode 400b. The gate pad 120 and the data pad 220 are formed over the substrate 101. Also, the insulating layers 150 and 250 may be formed on the entire surface of the substrate 101, wherein the insulating layers 150 and 250 have contact holes that correspond to the gate pad 120 and the data pad 220. Then, the gate pad electrode 400a and the data pad electrode 400b are respectively connected with the gate pad 120 and the data pad 220 through the contact holes. The gate pad electrode 400a and the data pad electrode 400b are formed of the conductive photoresist including the conducting polymer.

In addition, other varying components of the LCD device may be formed, and the variations may be within the scope known to those skilled in the art.

Second Embodiment

Figure 5A:
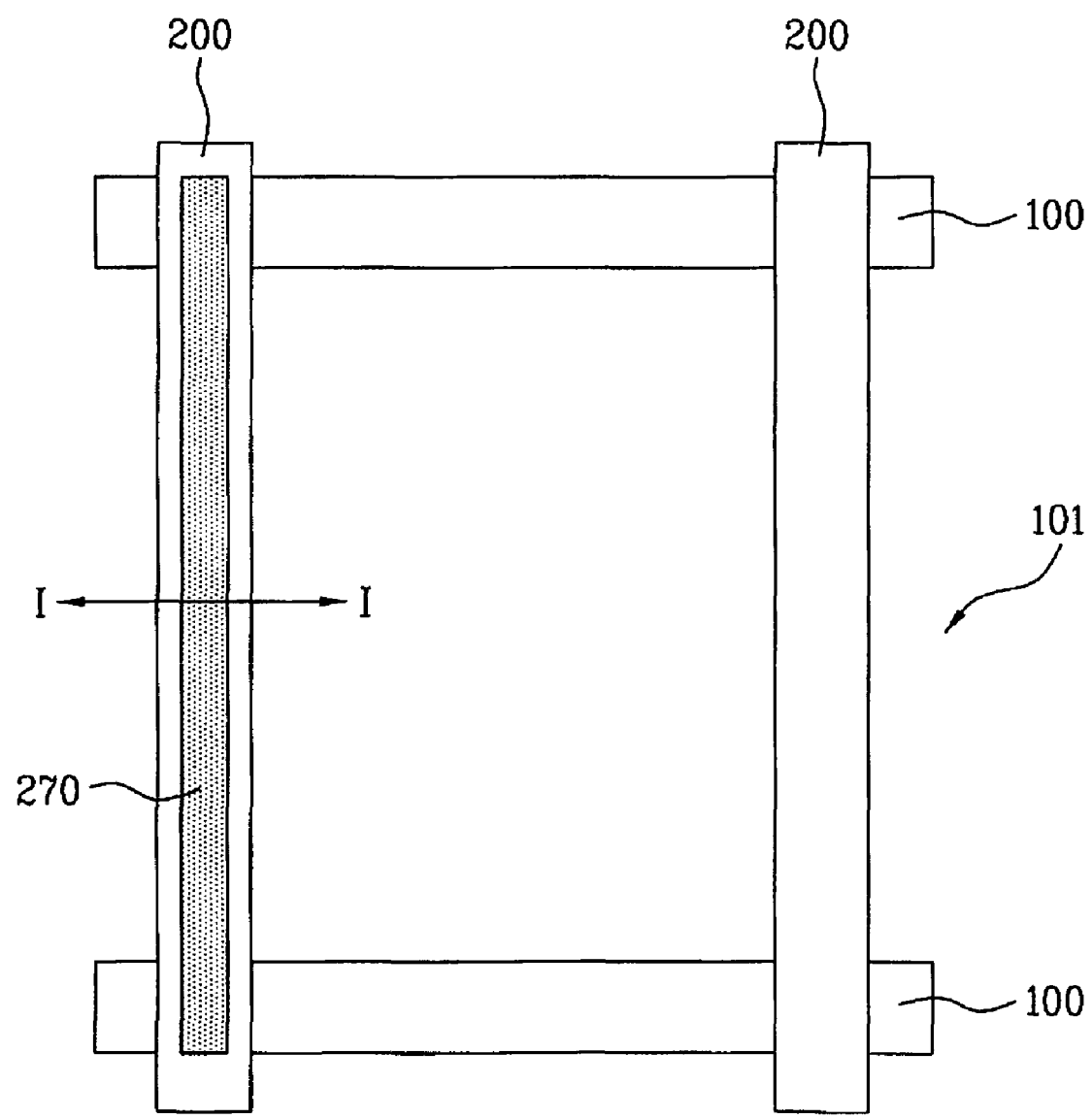
FIG. 5A is a plan view illustrating a unit pixel region of an LCD device according to the present invention.
Figure 5B:
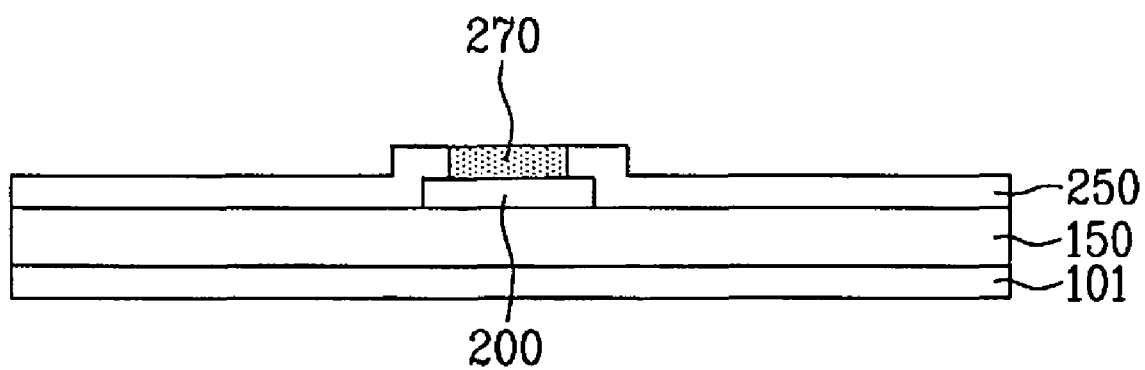
FIG. 5B is a cross sectional view taken along line I-I of FIG. 5A.

FIGS. 5A and 5B illustrate an example in which a conductive photoresist is applied to a disconnection-prevention line of an LCD device according to the present invention. FIG. 5A is a plan view illustrating a unit pixel region of an LCD device according to the present invention, and FIG. 5B is a cross sectional view taken along line I-I of FIG. 5A.

As shown in FIG. 5A, a gate line 100 is formed in a first direction on a substrate 101. Then, a data line 200 is formed in a second direction substantially perpendicular to the first direction.

In addition, a disconnection-prevention line 270 is formed. As shown, the disconnection-prevention line 270 may be formed on the data line 200. However, the disconnection-prevention line 270 may be formed on the gate line 100.

A thin film transistor (not shown) is formed at a crossing of the gate line 100 and the data line 200.

Referring to FIG. 5B, a gate insulating layer 150 is formed under the data line 200, thus insulating the data line 200 from the gate line 100. Also, a passivation layer 250 is formed on the data line 200. Then, the data line 200 is connected with the disconnection-prevention line 270 through a contact hole formed in the passivation layer 250 on the data line 200.

The disconnection-prevention line 270 is formed on the gate line 100 or the data line 200. Accordingly, even though the gate line 100 or the data line 200 is disconnected, the disconnection-prevention line 270 prevents a malfunction of the LCD device.

The disconnection-prevention line 270 may be formed of conductive photoresist. A method for forming the disconnection-prevention line 270 may be identical to a method for forming a pad electrode shown in FIGS. 3A to 3D.

That is, the gate line 100, the gate insulating layer 150, the data line 200, and the passivation layer 250 may be sequentially formed on the substrate 101. Then, the contact hole may be formed on the gate line 100 in the gate insulating layer 150 and the passivation layer 250, or the contact hole may be formed on the data line 200 in the passivation layer 250. Then, the conductive photoresist may be coated on an entire surface of the substrate including the contact hole. Then, the disconnection-prevention line 270 of conductive photoresist is formed in the contact hole by ashing the conductive photoresist. The material of the conductive photoresist and the ashing conditions may be identical to those of the first embodiment of the present invention.

Third Embodiment

Figure 6A:
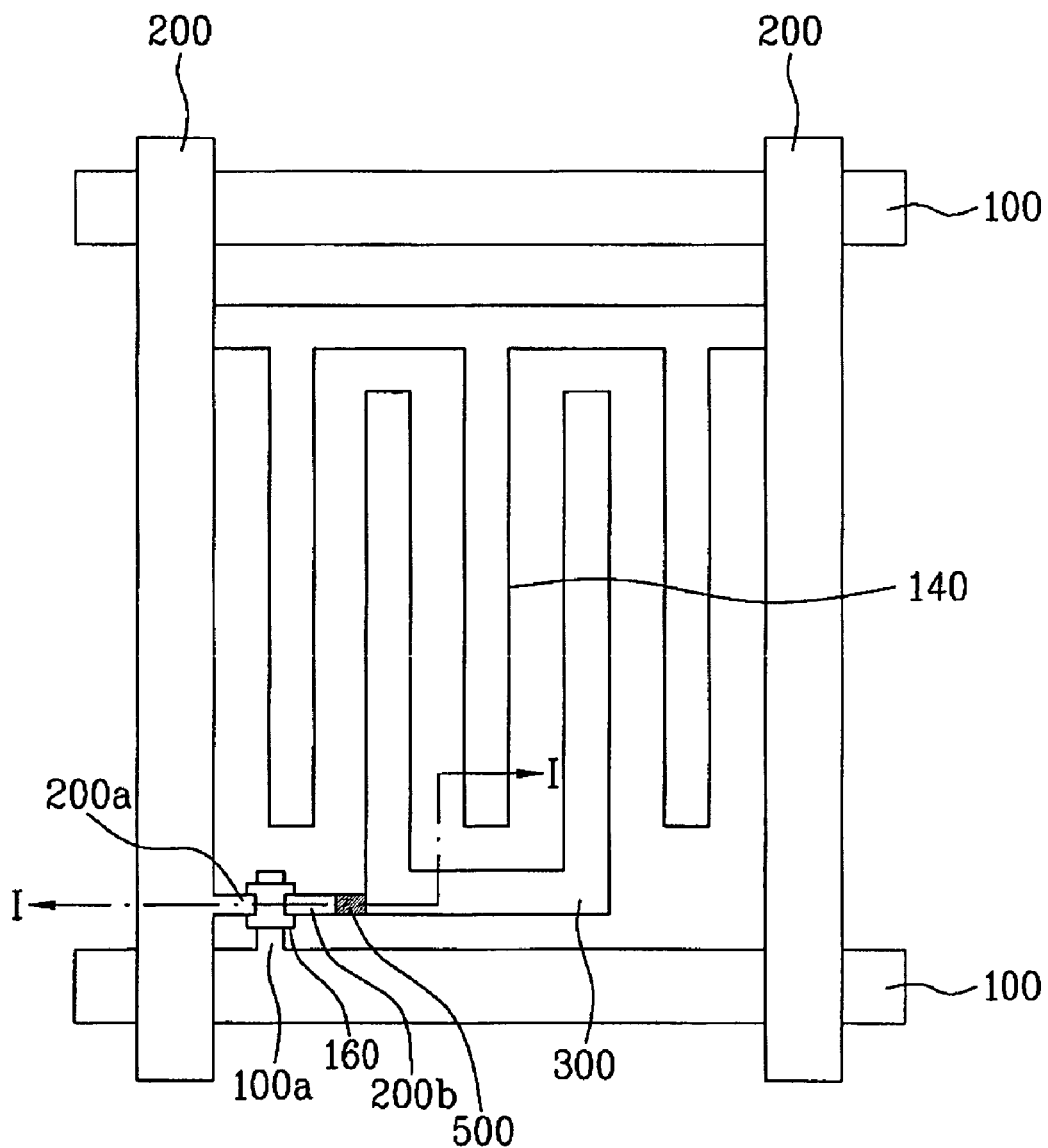
FIG. 6A is a plan view illustrating a unit pixel region of an IPS mode LCD device according to the present invention.
Figure 6B:
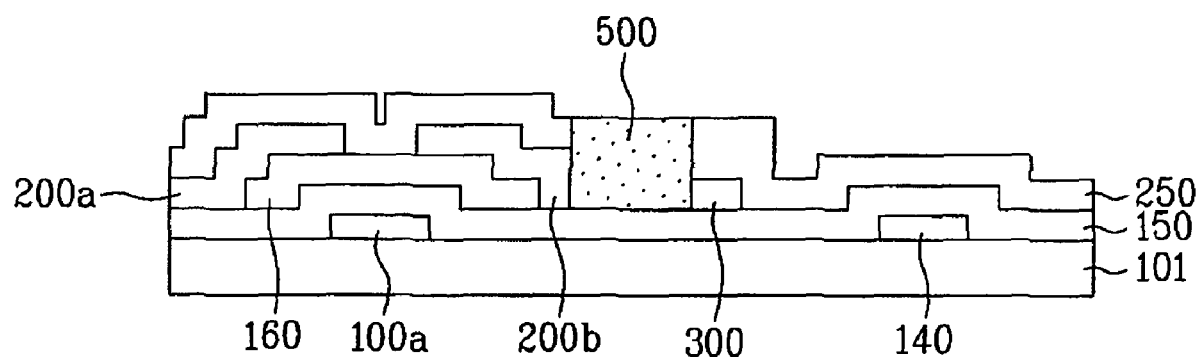
FIGS. 6B to 6C are cross sectional views taken along line I-I of FIG. 6A.
Figure 6C:
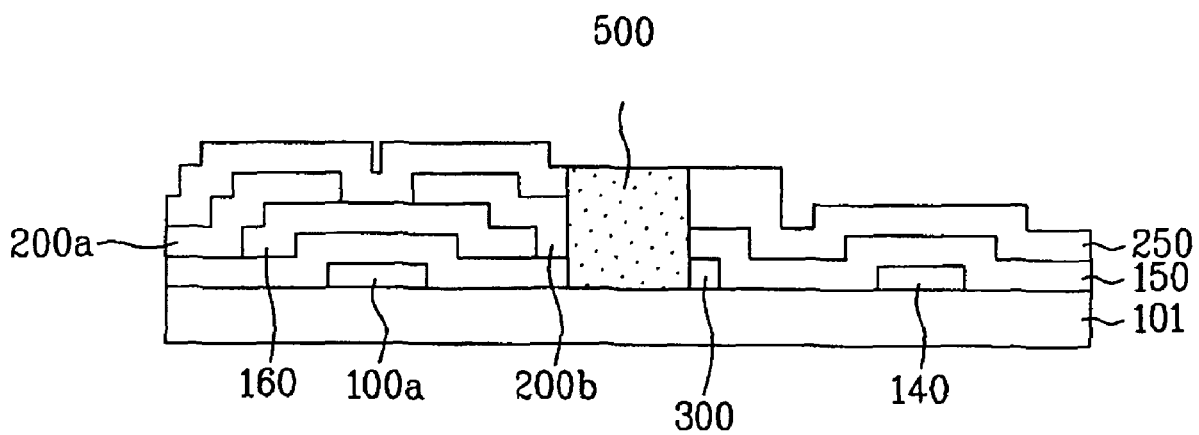

FIGS. 6A, 6B, and 6C illustrate an example in which a conductive photoresist is applied to a bridge electrode of an IPS mode LCD device according to the present invention. FIG. 6A is a plan view illustrating a unit pixel region of an IPS mode LCD device according to the present invention, and FIGS. 6B and 6C are cross sectional views taken along line I-I of FIG. 6A.

As shown in FIG. 6A, a gate line 100 and a data line 200 are formed substantially perpendicular to each other on a substrate 101, whereby a unit pixel region is defined with the gate and data lines 100 and 200.

Then, a thin film transistor is formed at a crossing of the gate and data lines 100 and 200. The thin film transistor includes a gate electrode 100a, a semiconductor layer 160, a source electrode 200a, and a drain electrode 200b. The gate electrode 100a protrudes from the gate line 100, the source electrode 200a protrudes from the data line 200, and the drain electrode 200b is opposite to the source electrode 200a. A structure of the thin film transistor may be varied within the scope known to those in the related art.

In the unit pixel region, a common electrode 140 and a pixel electrode 300 are formed substantially in parallel. Then, a bridge electrode 500 electrically connects the drain electrode 200b with the pixel electrode 300.

Referring to FIG. 6B, the pixel electrode 300 may be formed at the same layer as the drain electrode 200b. In this case, the bridge electrode 500 electrically connects the drain electrode 200b with the pixel electrode 300 through a contact hole formed in the passivation layer 250.

As shown in FIG. 6C, the pixel electrode 300 may be formed on the same layer as the common electrode 140. In this case, the bridge electrode 500 electrically connects the drain electrode 200b with the pixel electrode 300 through a contact hole formed in the gate insulating layer 150 and the passivation layer 250.

The bridge electrode 500 may be formed of conductive photoresist. A method for forming the bridge electrode may be identical to a method for forming a pad electrode shown in FIGS. 3A to 3D.

As shown in FIG. 6B, if the pixel electrode 300 is formed at the same layer as the drain electrode 200b, the gate electrode 100a and the common electrode 140 are formed on the substrate 101. Then, the gate insulating layer 150 may be formed on the entire surface of the substrate 101. Then, the semiconductor layer 160 may be formed on a predetermined portion of the gate insulating layer 150. Also, the source and drain electrodes 200a and 200b may be positioned on both sides of the semiconductor layer 160, and the pixel electrode 300 may be formed substantially in parallel with the common electrode 140. Thereafter, the passivation layer 250 may be formed on the entire surface of the substrate 101. Also, the contact hole may be formed in the passivation layer 250 between the drain electrode 200b and the pixel electrode 300. Then, the conductive photoresist may be coated on the entire surface of the substrate 101 including the contact hole, and the bridge electrode 500 of conductive photoresist is formed in the contact hole by ashing the conductive photoresist.

Referring to FIG. 6C, if the pixel electrode 300 is formed in the same layer as the common electrode 140, the gate electrode 100a, the common electrode 140 and the pixel electrode 300 are formed on the substrate 101, wherein the pixel electrode 300 is formed substantially in parallel with the common electrode 140. Then, the gate insulating layer 150 may be formed on the entire surface of the substrate 101. Also, the semiconductor layer 160 may be formed on a predetermined portion of the gate insulating layer 150, and the source and drain electrodes 200a and 200b may be formed on both sides of the semiconductor layer 160. Thereafter, the passivation layer 250 may be formed on the entire surface of the substrate 101. Then, the contact hole may be formed in the gate insulating layer 150 and the passivation layer 250 between the drain electrode 200b and the pixel electrode 300. Then, the conductive photoresist may be coated on the entire surface of the substrate including the contact hole, and the bridge electrode 500 of conductive photoresist is formed in the contact hole by ashing the conductive photoresist.

The material of conductive photoresist and the ashing conditions may be identical to those of the first embodiment of the present invention.

In addition, other varying components of the IPS mode LCD device may be formed, and the variations may be within the scope known to those skilled in the art.

As mentioned above, the method for forming the pad electrode and the LCD device manufactured by the method according to the present invention have the following advantages.

In the present invention, it is possible to form the pad electrode, the disconnection-prevention line, and the bridge electrode of the IPS mode LCD device in a simple method by ashing the conductive photoresist. Thus, costs are decreased and a simplified process is obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an LCD device comprising:
forming a metal line on a substrate;
forming an insulating layer on a surface of the substrate including the metal line;
forming a hole in the insulating layer on the metal line;
coating a conductive photoresist on the surface of the substrate including the hole; and
forming a disconnection-prevention line of conductive photoresist in the hole by ashing the conductive photoresist.

2. The method of claim 1, wherein the metal line is a gate line or a data line.

3. The method of claim 1, wherein the ashing is performed with oxygen plasma.

4. A method of manufacturing an LCD device comprising:
forming a gate electrode and a common electrode on a substrate;
forming a gate insulating layer on a surface of the substrate;
forming a semiconductor layer on a predetermined portion of the gate insulating layer;
forming source and drain electrodes on both sides of the semiconductor layer; forming a pixel electrode substantially in parallel with the common electrode;
forming a passivation layer on the surface of the substrate;
forming a contact hole in the passivation layer between the drain electrode and the pixel electrode;
coating a conductive photoresist on the surface of the substrate including the contact hole; and
forming a bridge electrode of conductive photoresist in the contact hole by ashing the coated conductive photoresist.

5. The method of claim 4, wherein the ashing process is performed with oxygen plasma.

6. A method of manufacturing an LCD device comprising:
forming a gate electrode, a common electrode, and a pixel electrode on a substrate, wherein the common electrode is formed substantially in parallel with the pixel electrode;
forming a gate insulating layer on a surface of the substrate;
forming a semiconductor layer on a predetermined portion of the gate insulating layer;
forming source and drain electrodes on both sides of the semiconductor layer;
forming a passivation layer on the surface of the substrate;
forming a contact hole in the gate insulating layer and the passivation layer between the drain electrode and the pixel electrode;
coating a conductive photoresist on the surface of the substrate including the contact hole; and
forming a bridge electrode of conductive photoresist in the contact hole by ashing the coated conductive photoresist.

7. The method of claim 6, wherein the ashing process is performed with oxygen plasma.

8. An LCD device comprising:
a substrate;
a gate line formed in a first direction on the substrate;
a data line formed in a second direction substantially perpendicular to the first direction;
an insulating layer on the substrate, wherein the insulating layer has a contact hole that corresponds to at least one of the gate and data lines; and
a disconnection-prevention line connected with the at least one of the gate and data lines through the contact hole, wherein the disconnection-prevention line is formed of conductive photoresist.

9. The LCD device of claim 8, wherein the conductive photoresist is formed of a conducting polymer material selected from groups of

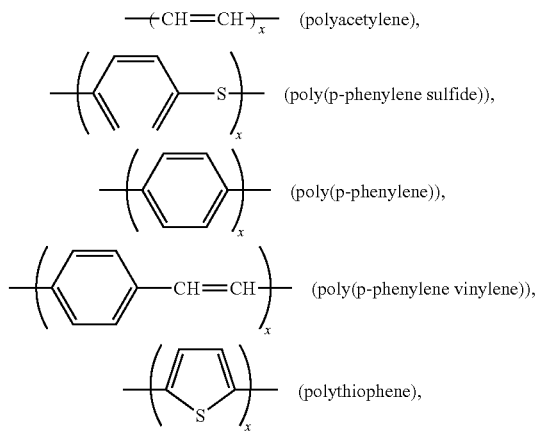

-continued

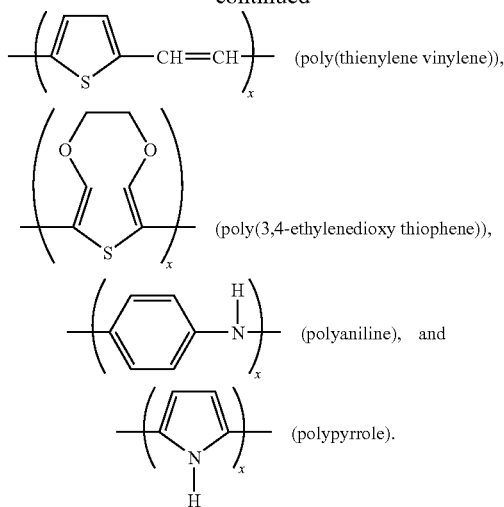

10. An LCD device comprising:
a substrate;
gate and data lines substantially perpendicular to each other on the substrate, so as to define a unit pixel region;
common and pixel electrodes substantially parallel to each other inside the unit pixel region;
a thin film transistor at a crossing of the gate and data lines, wherein the thin film transistor includes of a gate electrode, a semiconductor layer, a source electrode, and a drain electrode; and
a bridge electrode that connects the drain electrode and the pixel electrode, wherein the bridge electrode is formed of conductive photoresist.

11. The LCD device of claim 10, wherein the drain electrode and pixel electrode are formed on a same layer.

12. The LCD device of claim 10, wherein the drain electrode and pixel electrode are formed on different layers.

13. The LCD device of claim 10, wherein the conductive photoresist is formed of a conducting polymer material selected from groups of

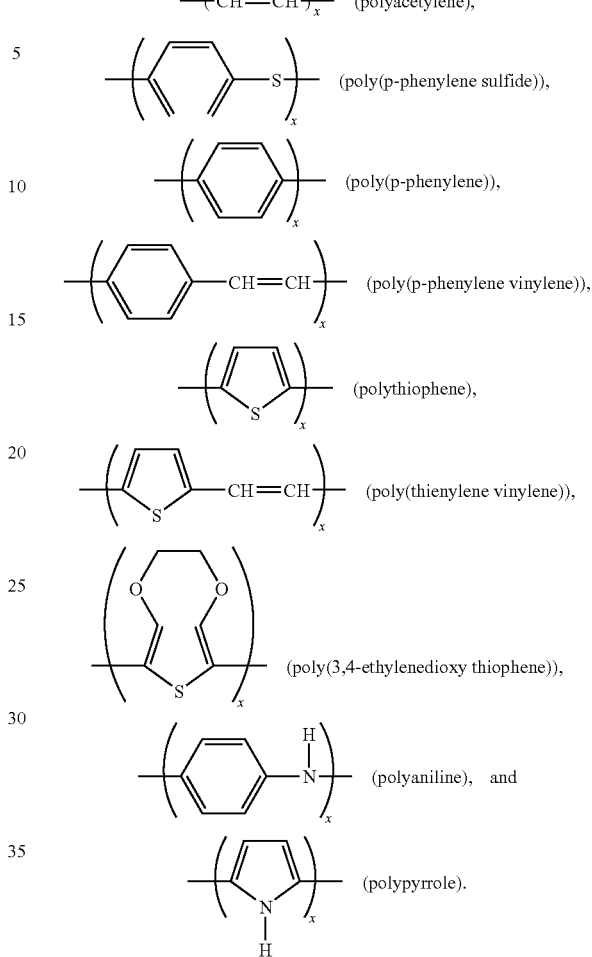

* * * * *